(12) United States Patent
Itagaki et al.

(10) Patent No.: US 8,137,519 B2
(45) Date of Patent: Mar. 20, 2012

(54) SPUTTERING CATHODE, SPUTTERING APPARATUS PROVIDED WITH SPUTTERING CATHODE, FILM-FORMING METHOD, AND METHOD FOR MANUFACTURING ELECTRONIC DEVICE

(75) Inventors: Katsunori Itagaki, Tokyo (JP); Tomoo Uchiyama, Fuchu (JP); Yasuko Hari, Yamato (JP); Hiroaki Saito, Sagamihara (JP); Toshinobu Chiba, Kawasaki (JP)

(73) Assignee: Canon Anelva Corporation, Kawasaki-Shi (JP)

( * ) Notice: Subject to any disclaimer, the term of this patent is extended or adjusted under 35 U.S.C. 154(b) by 507 days.

(21) Appl. No.: 12/397,882

(22) Filed: Mar. 4, 2009

(65) Prior Publication Data
US 2009/0229970 A1 Sep. 17, 2009

(30) Foreign Application Priority Data

Mar. 13, 2008 (JP) .................................. 2008-063515
Jun. 27, 2008 (JP) .................................. 2008-168783

(51) Int. Cl.
*C23C 14/00* (2006.01)
(52) U.S. Cl. ........... 204/298.2; 204/192.12; 204/298.23; 204/298.27

(58) Field of Classification Search ............. 204/192.12, 204/298.19, 298.2, 298.23, 298.27
See application file for complete search history.

(56) References Cited

U.S. PATENT DOCUMENTS
5,833,815 A * 11/1998 Kim et al. ................ 204/192.12

FOREIGN PATENT DOCUMENTS
JP 08-199354 8/1996
* cited by examiner

*Primary Examiner* — Christopher Young
(74) *Attorney, Agent, or Firm* — Fitzpatrick, Cella, Harper & Scinto

(57) ABSTRACT

The present invention provides a sputtering cathode whereby it is possible to increase the degree of freedom to adjust a distance between a target and a magnet unit. A sputtering cathode in accordance with one embodiment of the present invention includes a plurality of magnet units arranged at positions opposite to the rear surface of the target and a distance adjusting mechanism for separately adjusting a distance between the target and a magnet unit for each magnet unit. In addition, the sputtering cathode includes a reciprocating movement mechanism for reciprocating a plurality of magnet units in parallel to the rear surface of the target. The plurality of magnet units, the distance adjusting mechanism and the reciprocating movement mechanism may be housed in a magnet chamber that can be evacuated.

6 Claims, 6 Drawing Sheets

FIG. 5A
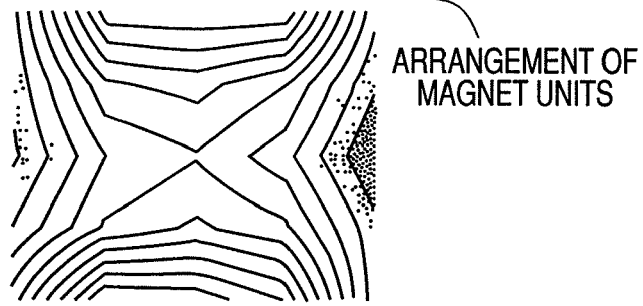
LOWER LAYER
VARIATION OF FILM THICKNESS
DISTRIBUTION: ±14%
FIG. 5B
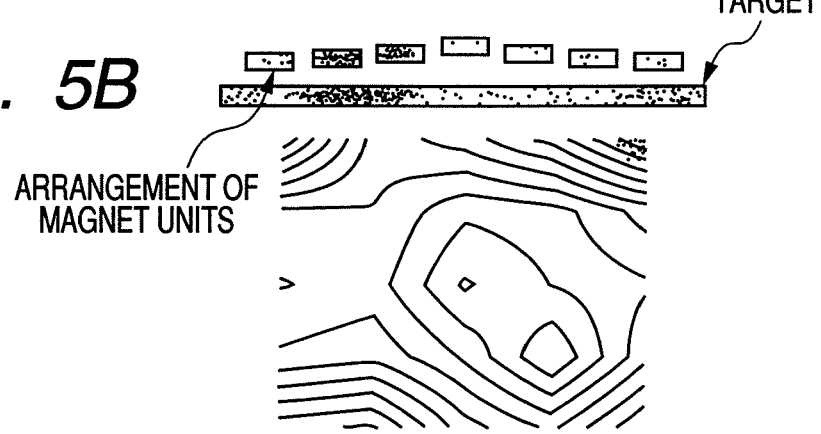
UPPER LAYER
VARIATION OF FILM THICKNESS
DISTRIBUTION: ±4.6%
FIG. 5C
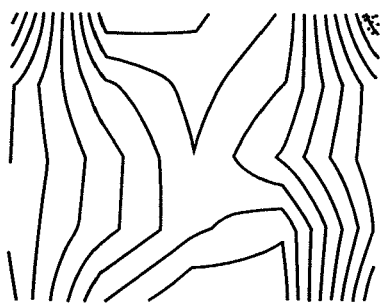
UPPER AND LOWER LAYERS COMBINED
VARIATION OF FILM THICKNESS
DISTRIBUTION: ±8.5%

LOWER LAYER
VARIATION OF FILM THICKNESS
DISTRIBUTION: ±38%

UPPER LAYER
VARIATION OF FILM THICKNESS
DISTRIBUTION: ±4.6%

UPPER AND LOWER LAYERS COMBINED
VARIATION OF FILM THICKNESS
DISTRIBUTION: ±23%

SPUTTERING CATHODE, SPUTTERING APPARATUS PROVIDED WITH SPUTTERING CATHODE, FILM-FORMING METHOD, AND METHOD FOR MANUFACTURING ELECTRONIC DEVICE

CROSS-REFERENCES TO RELATED APPLICATIONS

This application claims the benefit of priorities from Japanese Patent Application No. 2008-063515 filed on Mar. 13, 2008 and No. 2008-168783 filed on Jun. 27, 2008, the entire contents of which is incorporated herein by reference.

BACKGROUND OF THE INVENTION

1. Field of the Invention

The present invention relates to a sputtering cathode used in particular for a magnetron sputtering apparatus, a sputtering apparatus provided with the sputtering cathode, a film-forming method, and a method for manufacturing an electronic device.

2. Related Background Art

Conventionally, there have been proposed various types of sputtering cathode structures as those for sputtering apparatuses. A magnetron-based sputtering cathode, among these structures, has a high deposition rate and is, therefore, most often used industrially.

Conventionally, there have been various types of magnetron-based cathodes. At present, a sputtering apparatus equipped with a planar magnetron cathode provided with a planar-shaped target, among sputtering apparatus having a magnetron-based sputtering cathode, is industrially most useful.

A sputtering apparatus provided with a planar-shaped target is used to manufacture electronic devices mainly, such as semiconductors and electronic components. In the manufacture of liquid-crystal display (LCD) panels and solar cells, among other electronic devices, a sputtering apparatus provided with a rectangular magnetron-based sputtering cathode is used to form electrodes and interconnects. In recent years, there has been a growing demand, along with an increase in the size of LCD panels and solar cells, that a sputtering apparatus deposits thin films on a large-area substrate.

For example, there is mentioned a thin-film solar cell formed of a common compound semiconductor, as an example of electronic devices including a multilayer film.

As one example of the basic structure of the solar cell, there can be mentioned a structure in which an Mo electrode layer to serve as a back electrode (positive electrode) is film-formed on an SLG (soda-lime glass) substrate, a light-absorbing layer is deposited on the Mo electrode layer, and a transparent electrode layer made of ZnO:Al or the like and intended to serve as a negative electrode is deposited on the light-absorbing layer through a buffer layer made of ZnS, CdS or the like. These layers are respectively deposited by means of sputtering using a magnetron-based cathode.

In general, one or a plurality of planar rectangular magnet units are used for a planar magnetron cathode provided with a target having a planar rectangular shape. The rectangular-shaped magnet unit is configured by arranging a bar-like magnet intended to serve as a central magnetic pole and a peripheral magnetic pole surrounding the bar-like magnet on a yoke made of a soft magnetic substance. The polarity of the central magnetic pole and the polarity of the peripheral magnetic pole are made opposite to each other.

A technique to form a thin film on a large-area substrate is disclosed in Japanese Patent Application Laid-Open No. H8-199354. Japanese Patent Application Laid-Open No. H8-199354 discloses the configuration of a cathode in which a plurality of rectangular-shaped magnet units are used so that a spacing between respective magnet units can be adjusted independently, and a mechanism, whereby a distance between a target and a surface of a magnet can be adjusted, is provided on both ends of each magnet unit in the long-side direction (longitudinal direction) thereof.

As is obvious from the description given above, in film formation using a cathode provided with magnet units, it is possible to uniformize the density distribution of plasma in the longitudinal direction of a magnet unit. Accordingly, the method described in Japanese Patent Application Laid-Open No. H8-199354 is extremely effective. However, even such an effective configuration as described above has problems that remain to be solved in order to further improve a film thickness distribution.

In particular, in the configuration shown in Japanese Patent Application Laid-Open No. H8-199354, the mechanism whereby a distance between the target and the surface of a magnet can be adjusted is provided only at both ends of each magnet unit in the long-side direction thereof. Accordingly, the only way to adjust a film thickness distribution in the long-side direction of the magnet unit is to tilt the magnet. Thus, there has been the problem to be solved that restrictions are imposed on the degree of freedom of film formation, including the adjustment of the film thickness distribution.

Another problem is that a driving system for causing each magnet unit to make a sliding movement and the mechanism for adjusting a distance between the target and the surface of the magnet are integrated with each other. Accordingly, a mechanism for driving the magnet unit is complicated. Thus, the configuration has problems to be solved, including the problem that a difficulty arises in maintenance work and the like.

Yet another problem is that in the configuration described in Japanese Patent Application Laid-Open No. H8-199354, the driving system for causing each magnet unit to make a reciprocating movement and the mechanism for adjusting a distance between the target and the surface of the magnet are arranged on the atmosphere side. Although the inside of a sputtering chamber, which is the vacuum side, and the atmosphere side are isolated from each other by a backing plate for supporting the target, a high pressure is applied to the backing plate when the sputtering chamber is evacuated. Accordingly, increasing the sizes of the target and the backing plate along with an increase in the size of a substrate, which is an object to be film-formed, causes an increase in the amount of warpage of the target and the backing plate due to the pressure difference thereof from the atmospheric pressure. As a result, the film thickness distribution may become nonuniform due to the nonuniformity of magnetic field distribution on the target.

SUMMARY OF THE INVENTION

Hence, an object of the present invention is to provide a sputtering cathode whereby the degree of freedom of positional adjustment with respect to a distance between a target and a magnet unit can be increased, and a sputtering apparatus provided with the sputtering cathode.

Another object of the present invention is to provide a sputtering cathode whereby a time required to adjust the distance between the target and the magnet unit can be shortened, and a sputtering apparatus provided with the sputtering cathode.

Yet another object of the present invention is to provide a film-forming method and a method for manufacturing an electronic device using a sputtering apparatus provided with a sputtering cathode in accordance with the present invention whereby the variation of film thickness distribution is not increased even if sputtering conditions are changed halfway between the start and end of film formation.

A first aspect of the present invention is a sputtering cathode comprising a plurality of magnet units arranged at positions opposite to a surface for supporting a target, each of the magnet units having:

a magnet of the magnet unit; a distance adjusting mechanism for adjusting a distance from the magnet to the surface; and a reciprocating movement mechanism for reciprocating the magnet in parallel to the surface; wherein magnet units are arranged along a direction different from a direction of the reciprocating.

A second aspect of the present invention is a sputtering apparatus including the sputtering cathode in accordance with the first aspect.

A third aspect of the present invention is a control apparatus for controlling the sputtering apparatus according to the second aspect, wherein when in predetermined film formation using the same target, sputtering conditions are changed in the course of the film formation, the control apparatus controls the distance adjusting mechanism, so as to adjust the distance in such a manner as to suppress an increase in the variation of film thickness distribution due to a change in the sputtering conditions for each time of the change and in each of the magnet units.

A fourth aspect of the present invention is a film-forming method by means of sputtering using a magnetron-based cathode in which a target is loaded at a position opposite to a substrate arranged within a depressurized chamber and a plurality of magnet units are provided on the rear-surface side of the target, wherein when sputtering conditions are changed in the course of film formation by means of sputtering using the same target, the method controls the distance between the target and the magnet, so as to suppress an increase in the variation of film thickness distribution due to a change in the sputtering conditions for each time of the change and in each of the magnet units.

A fifth aspect of the present invention is a method for manufacturing an electronic device by means of sputtering using a magnetron-based cathode in which a target is loaded at a position opposite to a substrate arranged within a depressurized chamber and a plurality of magnet units are provided on the rear-surface side of the target, wherein when sputtering conditions are changed in the course of film formation by means of sputtering using the same target, the method controls the distance between the target and the magnet, so as to suppress an increase in the variation of film thickness distribution due to a change in the sputtering conditions for each time of the change and in each of the magnet units.

According to the present invention, it is possible to provide a sputtering cathode, whereby the degree of freedom to adjust a distance between the target and each magnet unit can be increased and/or a time required for the adjustment can be shortened, and a sputtering apparatus provided with the sputtering cathode.

In addition, since the magnet units therefore respectively include a distance adjusting mechanism and a reciprocating movement mechanism independent of each other, it is possible to perform maintenance by replacement or the like only on a magnet unit or units, among magnet units of the same shape, which are defective or require adjustments.

BRIEF DESCRIPTION OF THE DRAWINGS

FIG. 5A is a schematic view illustrating the states of film thickness distribution of a lower layer, and a diagrammatic arrangement of magnet units at the time of film-forming the lower layer in embodiment 1 of the present invention.

FIG. 5B is another schematic view illustrating the states of film thickness distribution of an upper layer, and a diagrammatic arrangement of magnet units at the time of film-forming the upper layer in embodiment 1 of the present invention.

FIG. 5C is yet another schematic view illustrating the states of film thickness distribution of a lower layer and an upper layer combined in embodiment 1 of the present invention.

DESCRIPTION OF THE PREFERRED EMBODIMENTS

Figure 1:
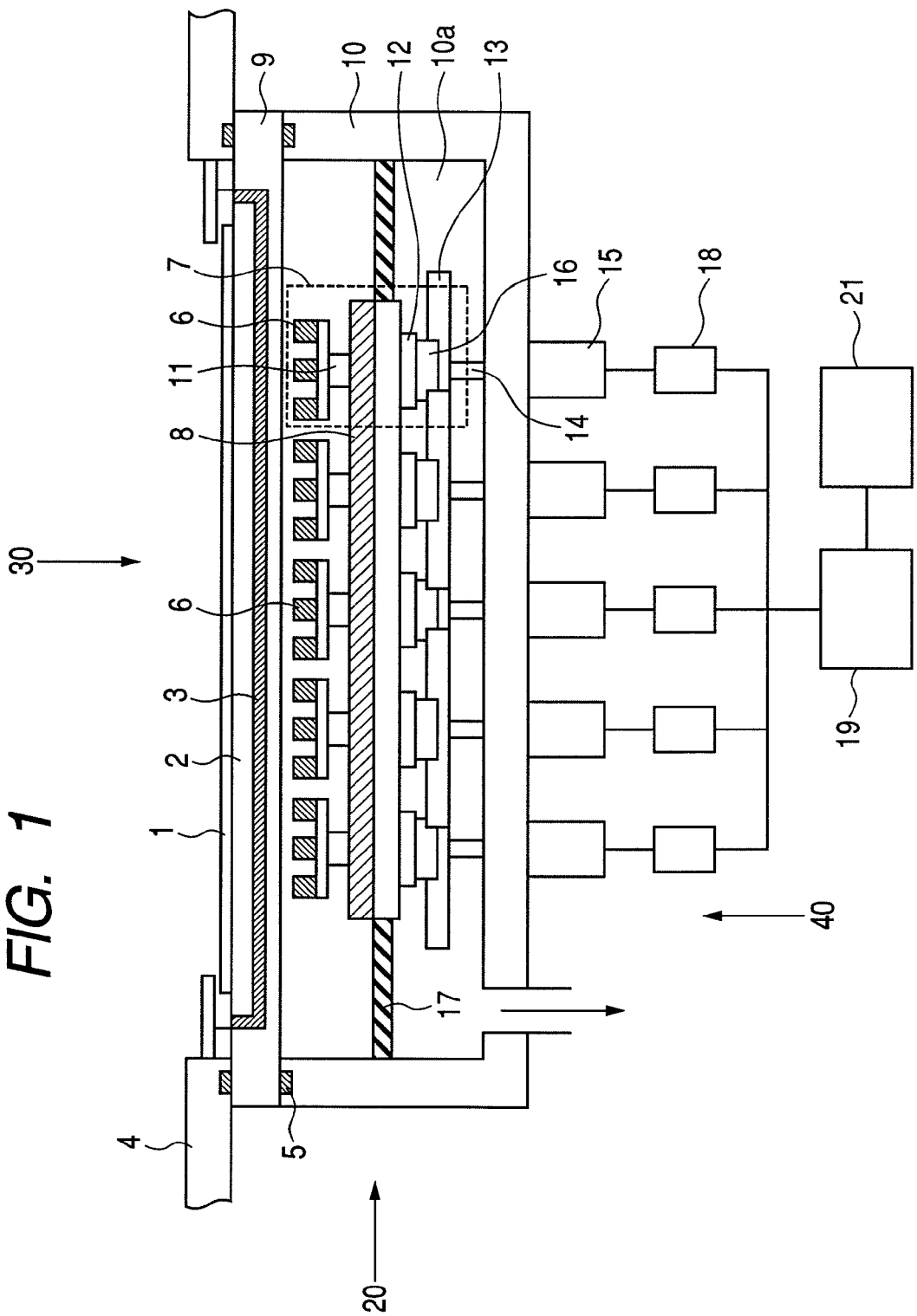
FIG. 1 is a vertical cross-sectional view of a sputtering cathode in accordance with one embodiment of the present invention.

Hereinafter, exemplary embodiments of the present invention will be described according to the accompanying drawings. Note that constituent elements having the same functions in the drawings explained in the present specification are denoted by like reference numerals and will not be explained again.

Figure 2:
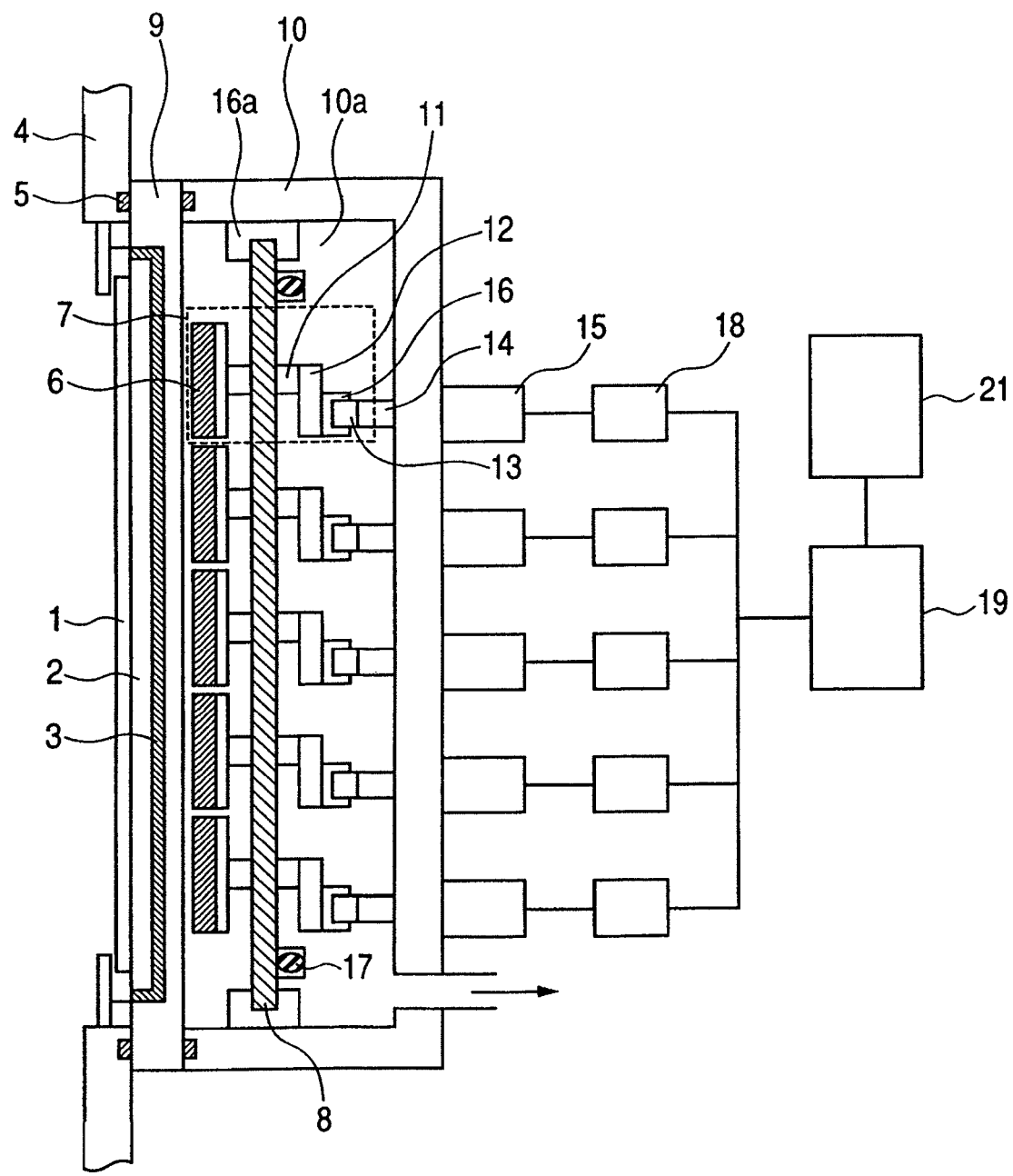
FIG. 2 is a vertical cross-sectional view of the sputtering cathode shown in FIG. 1.

FIG. 1 is a vertical cross-sectional view of a sputtering cathode in accordance with one embodiment of the present invention, whereas FIG. 2 is a horizontal cross-sectional view of the sputtering cathode shown in FIG. 1 taken along the direction of arrow 20. Both FIGS. 1 and 2 mainly show the internal configuration of the magnet chamber 10a of the sputtering cathode.

Figure 3:
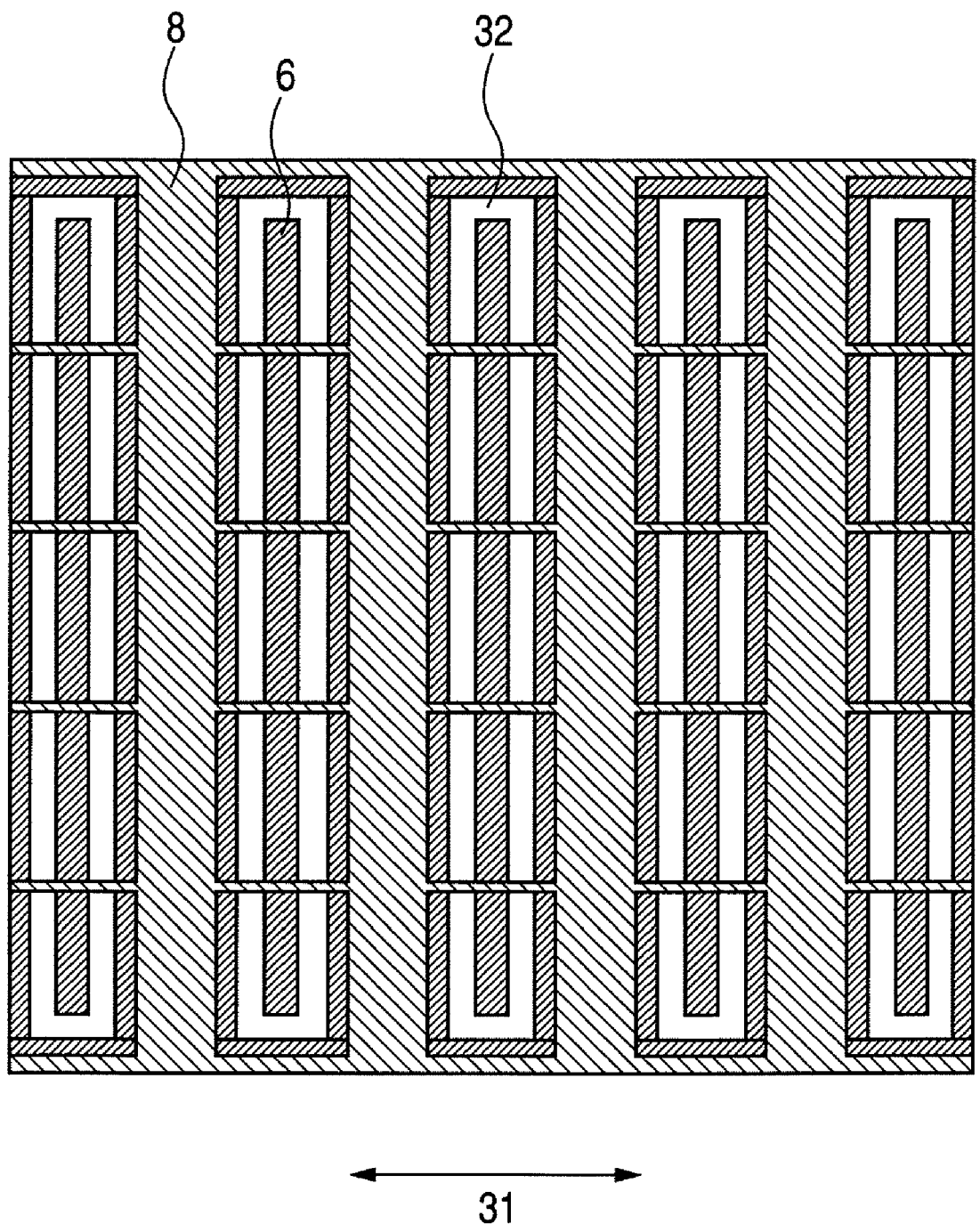
FIG. 3 is a front view illustrating the internal configuration of the magnet chamber of the sputtering cathode shown in, for example, FIG. 1.
Figure 4:
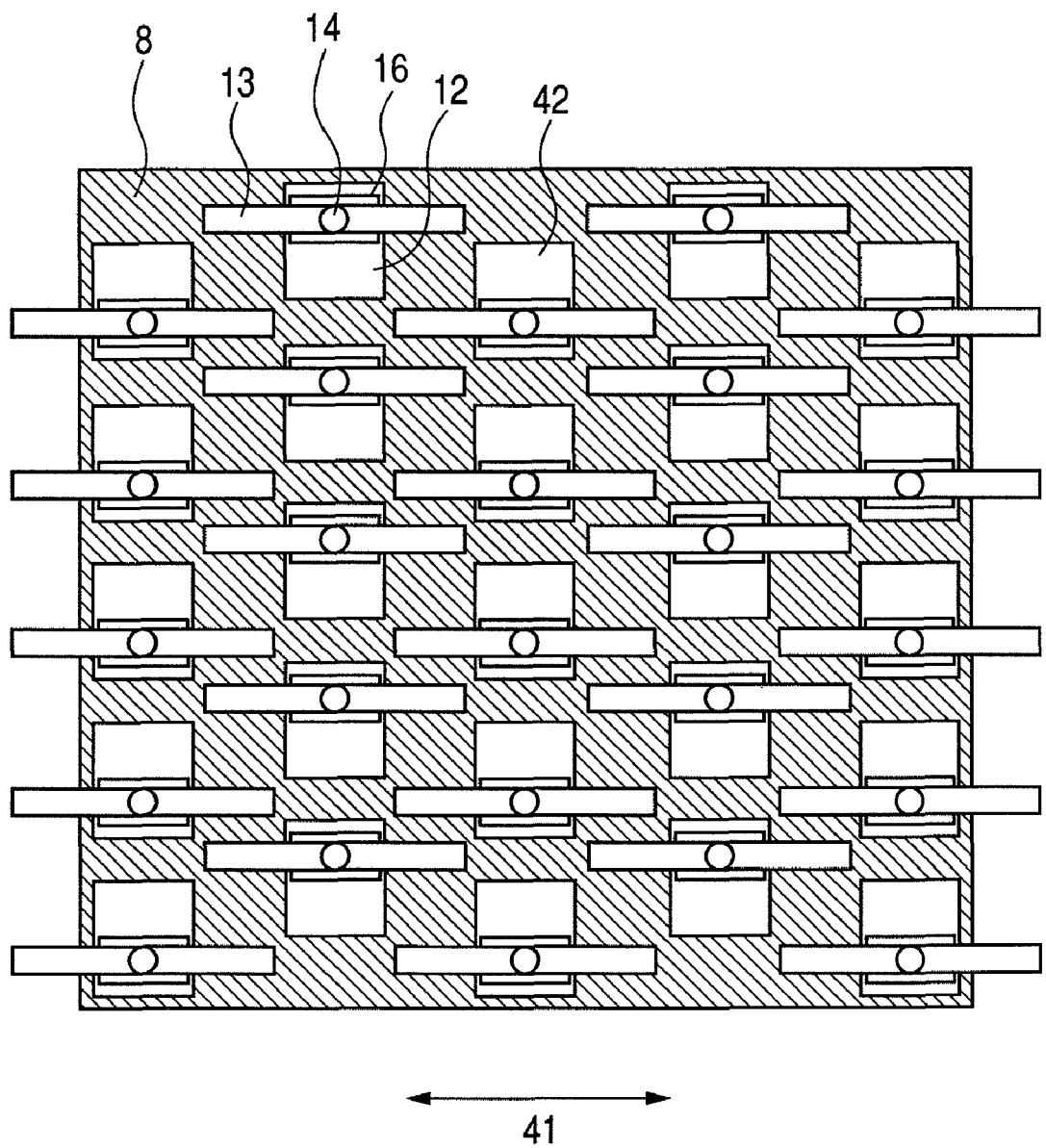
FIG. 4 is a rear view illustrating the internal configuration of the magnet chamber of the sputtering cathode shown in, for example, FIG. 1.

FIG. 3 is a front view of the internal configuration of the magnet chamber 10a of the sputtering cathode shown in FIG. 1 viewed in the direction of arrow 30, whereas FIG. 4 is a rear view of the internal configuration of the magnet chamber 10a viewed in the direction of arrow 40.

As shown in FIG. 1, the sputtering cathode of the present embodiment includes a backing plate 2 having contact with and supporting a target 1, a partition plate 9 including an insulator 3, and a cathode body 10.

A magnet chamber 10a is formed within the cathode body 10, and a plurality of magnet units 7 (denoted by a dotted line) are arranged in the magnet chamber 10a.

Note that the internal space of the cathode body 10 is encapsulated by the partition plate 9 and an O-ring 5 as the magnet chamber 10a. Accordingly, it is possible to evacuate the magnet chamber 10a within the cathode body 10 using an exhaust system different from an exhaust system used to evacuate a sputtering chamber (not illustrated) in which the target 1 is arranged.

The partition plate 9 is attached to a vacuum chamber wall 4 forming an unillustrated space (hereinafter referred to as the "sputtering chamber") within a sputtering apparatus in which sputtering is performed. The partition plate 9 and the vacuum chamber wall 4 are hermetically sealed from each other by the O-ring 5. Here, the "sputtering apparatus" refers to an apparatus provided at least with a sputtering chamber, in which the target 1 is arranged, and a sputtering cathode. The sputtering apparatus can further be provided with a treatment chamber for heating or the like performed prior to film formation by sputtering or a conveying chamber or the like for conveying an object to be film-formed between the vacuum side and the atmosphere side.

The sputtering cathode in accordance with the present invention is characterized in that a plurality of magnet units 7 including both the distance adjusting mechanism for adjusting a distance between the target 1 and a magnet 6 and the reciprocating movement mechanism for reciprocating the magnet units 7 in parallel to the rear surface of the target 1 are housed in the magnet chamber 10a of the cathode body 10, so that the plurality of magnet units 7 are arrayed along a predetermined direction (for example, along the longitudinal direction of a central magnet composing each magnet unit). Hereinafter, an explanation will be made of the distance adjusting mechanism of each magnet unit 7.

Note here that each magnet unit 7 includes a magnet 6, a magnet unit-supporting part 11, a magnet pedestal 12, a slide unit 16, a guide rail 13 and a shaft 14, and is coupled with the cathode body 10 through an actuator 15. The magnet unit-supporting part 11, the magnet pedestal 12, the slide unit 16, the guide rail 13, the shaft 14 and the actuator 15 are provided separately in each magnet unit 7.

A driving force output from the actuator 15 drives the magnet 6 through the shaft 14, the guide rail 13, the slide unit 16, the magnet pedestal 12 and the magnet unit-supporting part 11. The shaft 14 extends through a hole provided in the cathode body 10. The hole provided in the cathode body 10 and the shaft 14 are vacuum-sealed from each other so that the shaft 14 can freely move along a direction perpendicular to the rear surface of the target 1.

The magnet unit-supporting part 11 is coupled with the magnet 6 through a hole provided in a sliding pedestal 8 and is supported by the sliding pedestal 8, so as to be able to freely move along a direction perpendicular to the rear surface of the target 1.

Next, an explanation will be made of the actuator 15.

The actuator 15 is controlled by a control apparatus including a computer 19, a controller 18 and a display 21, and is adapted to be able to move each magnet unit 7 to a position (distance) set by the computer 19. The position of each magnet unit 7 can be freely set by the computer 19. That is, the computer 19 drives an actuator 15 corresponding to a magnet unit 7 to be driven, thereby moving a magnet 6 included in the magnet unit 7 to be driven in a direction perpendicular to the rear surface of the target 1 (direction perpendicular to the plane of the magnet 6).

The control apparatus can be further provided with an input operation unit (not illustrated) including a keyboard for inputting predetermined commands, data or the like, or switches of various types. Accordingly, when an operator inputs a predetermined instruction through the input operation unit, the control apparatus (computer) can move the magnet 6 included in the targeted magnet unit 7 to a predetermined position according to the accepted instruction.

Note that the computer may be built in the sputtering apparatus or may be a separate apparatus.

The display 21 is connected to the computer 19, so as to be able to display a relationship between sputtering conditions set in the computer 19 and the positions of magnet units 7. It is also possible to enable selection of a combination of sputtering conditions and the positions of magnet units 7 from this display. In this case, the operator may select a combination of sputtering conditions and the positions of magnet units 7 and input the combination to the control apparatus through the input operation unit.

As a result of such a configuration as described above being applied, each magnet unit 7 forms a distance adjusting mechanism for independently adjusting a distance between the target 1 and the magnet 6. For the distance adjusting mechanism, adjusting the distance between the magnet 6 and the target 1 is essence. The target 1 is placed on the backing plate 2 serving as a target-supporting part at least at the time of film formation. Accordingly, if a distance of the magnet 6 from the target-supporting surface of the backing plate 2 is adjustable, then it is possible to adjust the distance between the target 1 and the magnet 6. Thus, it is also possible to say that the distance adjusting mechanism of the present invention adjusts the distance of the magnet 6 from the target-supporting surface.

For example, if the sputtering cathode of the present invention is used, it is possible, as will be described later, to change the distance between the target and a magnet unit at least once in the course of film formation, so as to be able to differentiate the physical properties of a formed film, such as surface roughness, between the start and end of film formation using the same target.

In a case where the magnet chamber 10a of the cathode body 10 is not evacuated, an atmospheric pressure is applied to the partition plate 9. In this case, there may be caused the warpage of the partition plate 9, as has been described in the "Related Background Art" section. In the present embodiment, however, it is possible to provide an exhaust system different from that of the sputtering chamber in the magnet chamber 10a to evacuate the magnet chamber 10a. Thus, it is possible to also evacuate the magnet chamber 10a when the sputtering chamber is evacuated. That is, according to the configuration of the present embodiment, it is possible to reduce a pressure difference between a sputtering chamber (not illustrated) depressurized by an exhaust system different from an exhaust system for exhausting the magnet chamber 10a of the cathode body 10 and the magnet chamber within the cathode body 10, thereby decreasing a pressure applied to the partition plate 9. Consequently, it is possible to suppress a difference between the internal pressures of the sputtering chamber and the magnet chamber 10a even in a case where the sputtering chamber is evacuated, thereby suppressing warpage that may otherwise occur in the partition plate 9.

Consequently, according to the present embodiment, it is possible to sufficiently reduce the thickness of the partition plate 9. Thus, it is possible to shorten the distance between the rear surface of the target 1 and the magnet 6. As a result, it is possible to further increase the intensity of a magnetic field without causing the distribution of the magnetic field formed on the target 1 to become nonuniform.

However, when the sputtering chamber (not illustrated) is exhausted from the atmospheric pressure, the sputtering chamber must always be exhausted together with the magnet chamber 10a within the cathode body 10, in order to prevent an atmospheric pressure from being applied to the partition plate 9. Likewise, when the magnet chamber 10a within the cathode body 10 is changed from a vacuum state to an atmospheric pressure state, the magnet chamber 10a must be brought into an atmospheric pressure state together with the sputtering chamber (not illustrated).

Since the target 1 and the backing plate 2 are attached to the partition plate 9 through the insulator 3, electric power is applied only to the target 1 and the backing plate 2 when sputtering is performed. Consequently, it is possible to maintain structural objects within the cathode body 10 at the same potential. Thus, it is possible to prevent any abnormal electrical discharge from taking place, irrespective of an internal pressure.

Note that a water flow path (not illustrated) for flowing cooling water is formed within the backing plate 2. The target 1 is cooled by flowing cooling water through this water flow path.

Next, an explanation will be made of the reciprocating movement mechanism including magnet units 7.

The sliding pedestal 8 is attached to the cathode body 10 through the slide unit 16. The sliding pedestal 8 is configured so as to slide (reciprocate) on the slide unit 16 in a direction parallel to the rear surface of the target 1, when a ball screw 17 attached to the sliding pedestal 8 is rotated by an unillustrated driving system.

Consequently, as a result of the sliding pedestal 8 making such a sliding, the magnet 6, the magnet unit-supporting part 11, the magnet pedestal 12 and the slide unit 16 also slide on the guide rail 13 in a direction parallel to the rear surface of the target 1 (in the direction of arrow 31 in FIG. 3).

The reciprocating movement mechanism, which reciprocates each of the magnet units 7 in parallel to the rear surface of the target 1, includes the above-described sliding pedestal 8, ball screw 17, magnet unit-supporting part 11, magnet pedestal 12, and slide unit 16.

Note that when the sliding pedestal 8 slides, the guide rail 13, the shaft 14 and the actuator 15 do not move in a direction parallel to the rear surface of the target 1 since the guide rail, the shaft and the actuator are fixed on the cathode body 10.

As described above, in the configuration of the present embodiment, the reciprocating movement mechanism for moving each magnet 6 in parallel to the rear surface of the target 1 and the distance adjusting mechanism for moving each magnet unit 7 including the magnet 6 perpendicularly to the rear surface of the target 1 are configured to operate independently of each other.

That is, the operation of the actuator 15 and the slide unit 16 is controlled by the control apparatus provided with the computer 19, the controller 18 and the display 21, so that each magnet unit 7 (magnet 6) can be moved to a position set by the computer 19.

This means that it is possible to freely set the position of each magnet unit 7 using the computer 19. In addition, the display 21 is connected to the computer 19, so as to be able to display a relationship between sputtering conditions set in the computer 19 and the positions of magnet units 7 (magnets 6). Furthermore, it is possible to enable selection of a combination of sputtering conditions and the positions of magnet units 7 (magnets 6) from this display. Accordingly, an operator can set desired conditions through an input operation unit, according to information shown on the display 21.

In one embodiment of the present invention, the sputtering apparatus performs a continuous test in which the apparatus repeats the process of measuring the state of film thickness distribution using a noncontact film thickness sensor, inputting the results of this measurement to the computer 19, and adjusting a vertical distance between the target 1 and each magnet unit 7 (magnet 6), while preliminarily forming a film under certain sputtering conditions using a sputtering cathode in accordance with the present invention. In this way of measurement, the computer 19 can know the position of each magnet unit 7 (magnet 6) at which adjustments can be made so as to even more largely suppress the variation of film thickness distribution under the sputtering conditions. The positional information thus obtained may be stored in memory provided in the computer 19 as storage means.

As such measurement as described above, the sputtering apparatus, for example, performs film formation under certain sputtering conditions and measures the state of thickness distribution of a film thus obtained using the above-described film thickness sensor or the like. When the measurement is performed, the computer 19 calculates the amount of displacement of each magnet unit 7 according to the results of the measurement, so as to reduce the variation of film thickness distribution, and controls the distance adjusting mechanism on the basis of the amount of displacement. By means of this control, the sputtering apparatus performs trial film formation in which the sputtering apparatus repeats the process of adjusting the vertical distance between the target 1 and a predetermined magnet unit 7 in such a direction as to cause the film-thickness irregularity (variation of film thickness distribution) to decrease, and once again performing film formation under the same sputtering conditions. In this way of film formation, the computer 19 can know the position of each magnet unit 7 (magnet 6) at which the variation of film thickness distribution can be even more largely suppressed under the sputtering conditions. The positional information thus obtained may be stored in memory provided in the computer 19 as storage means.

The adjustment of a vertical distance between the target 1 and each magnet unit 7 is made, in general, by moving a magnet unit 7 (magnet 6) corresponding to a location, where the film thickness is large, away from the target 1 and moving a magnet unit 7 (magnet 6) corresponding to a location, where the film thickness is small, closer to the target 1. Accordingly, at the time of calculating the above-described amount of displacement, the computer 19, for example, extracts a region where the film thickness is relatively large (or small) with respect to other regions from the results of film thickness measurement. Next, according to the results of the extraction, if the film thickness is relatively large, the computer 19 may perform control, so as to increase the distance between the magnet unit corresponding to the region in question and the target. If the film thickness is relatively small, the computer 19 may perform control, so as to decrease the distance between the magnet unit corresponding to the region in question and the target.

In this way, in one embodiment of the present invention, the relationship of various sputtering conditions, such as the type of target, the power consumption thereof, and sputtering power, with the position of each magnet unit 7, at which the variation of film thickness distribution can be suppressed to an even smaller value under the sputtering conditions, is previously stored in the computer 19. In addition, sputtering conditions to be used at the time of actual manufacture are previously input to the computer 19. Consequently, it is possible to automatically move each magnet unit 7 to the optimum position at which the variation of film thickness distribution is not increased.

Furthermore, since the computer 19 stores the optimum position of a magnet unit 7 (magnet 6), which corresponds to such sputtering conditions as described above and at which the variation of film thickness distribution is not increased, it is possible to change sputtering conditions between the start and end of film formation also in the course of one step of film formation. That is, in one embodiment of the present invention, positional information related to a position optimum for each sputtering condition is stored in the memory of the computer 19 for each of the magnet units 7. Accordingly, when the sputtering conditions are changed in the course of predetermined film formation using the same target, the computer 19 refers to the above-described memory and acquires positional information appropriate for the sputtering conditions after change. Then, the computer 19 can control a vertical distance between the magnet unit and the target in each of the magnet units 7, based on the positional information, so as to suppress an increase in the variation of film thickness distribution due to a change in the sputtering conditions, for each change in the above-described sputtering conditions.

FIG. 3 is a schematic view illustrating the upper surface of the sliding pedestal 8 as viewed from the rear-surface side of the target 1.

As shown in FIG. 3, a magnet 6 includes a bar-like magnet serving as a central magnetic pole, and a peripheral magnetic pole which surrounds the magnet and has magnetism opposite to that of the central magnetic pole. Five magnet units 7 including magnets 6 are arrayed in the longitudinal direction of the figure (longitudinal direction of the central magnetic pole of each magnet 6). In addition, another five magnet units 7 (magnets 6) are arrayed in the lateral direction of the figure. Thus, FIG. 3 shows an example in which a total of 25 magnet units 7 (magnets 6) are arrayed in a matrix form. Arrow 31 denotes the moving direction of the magnets 6.

In the present embodiment, a group of magnet units is formed by arranging a plurality of magnet units 7 (five magnet units in FIG. 3) in a predetermined direction (for example, the longitudinal direction of the central magnetic pole of each magnet). In addition, the above-described group of magnet units is arranged in a plurality of arrays in a direction perpendicular to the above-described predetermined direction (direction of arrow 31 in FIG. 3). This way of arrangement means that one main magnet unit is segmented in the above-described predetermined direction which is a vertical direction to the reciprocating direction of magnet units 7, and a distance adjusting mechanism is provided in each of the segmented sub-magnet units. Consequently, in the present invention, it is also possible to make distance adjustments in an arbitrary region along the above-described predetermined direction, whereas in the past, distance adjustments were only possible at both ends of the above-described main magnet unit. That is, in the present embodiment, it is possible to distribute a position-adjustable region across the entire range of a region in which magnet units are arranged. It is therefore possible to establish a correct distance between a target and a magnet unit not only at both ends of each group of magnet units arranged along the above-described predetermined direction, but also in an arbitrary region. Accordingly, it is possible to improve the degree of freedom of positional adjustment with respect to a distance between the target and each magnet unit.

Note that the above-described predetermined direction is not limited to a direction perpendicular to the above-described reciprocating direction, but may be any direction other than those corresponding to the above-described reciprocating direction. If the above-described predetermined direction is set to a direction other than the direction perpendicular to the reciprocating direction, magnet units may be arranged at intervals of a predetermined distance so that the longitudinal direction of each group of magnet units is the predetermined direction.

However, since it is possible to arrange each magnet unit symmetrically with respect to the target if the direction perpendicular to the reciprocating direction is defined as the above-described predetermined direction, the predetermined direction is preferably defined as a direction perpendicular to the reciprocating direction, as shown in FIG. 3.

As shown in FIG. 4, a plurality of magnet units 7 are arranged in a matrix form within a plane substantially parallel to the rear surface of the target 1, both in longitudinal and lateral directions, at positions opposite to the rear surface of the target 1. For example, a magnet 6 denoted by reference numeral 32 in FIG. 3 corresponds to the magnet denoted by reference numeral 42 in FIG. 4.

As described above, each guide rail 13 is arranged, so as not to positionally coincide with guide rails 13 of at least both adjacent rows even in a case where there are arranged five rows, each consisting of five magnet units 7.

In other words, members, such as a guide rail 13 and a slide unit 16, composing each magnet unit 7 are arranged alternately with each other in longitudinal and lateral directions.

As shown in FIG. 4, while all of the guide rails 13 respectively included in the constituent members of magnet units 7 extend in the same direction (lateral direction of FIG. 4. i.e., the reciprocating direction), the constituent members of the plurality of magnet units 7 are arranged in a matrix form, as described above. Accordingly, the sputtering cathode can be configured in such a manner that each guide rail 13 is extended close to the central parts of adjacent guide rails 13.

Even if the sputtering cathode is configured in this way, the guide rails 13 do not structurally interfere with each other. Consequently, it is possible to set the amplitude of oscillation of magnet units 7 to a sufficiently wide range. In addition, it is possible to freely change the oscillation amplitude and a period of oscillation.

That is, in one embodiment of the present invention, the longitudinal direction of each guide rail 13 corresponds to the reciprocating direction of each magnet unit 7, and each guide rail 13 is arranged with shifts in the vertical direction to the longitudinal direction of the guide rail 13 for a guide rail adjacent in the longitudinal direction thereof. Consequently, guide rails adjacent to each other in the longitudinal direction thereof can be arranged so as to overlap with each other, thereby achieving space savings. In addition, it is possible to bring the centers of guide rails adjacent to each other in the longitudinal direction thereof closer to each other also in a configuration in which magnet units are arranged in a matrix form, in order to increase the degree of freedom of positional adjustment with respect to a distance between the target and a magnet unit, which is one of the characteristic configurations of the present invention. Accordingly, it is possible to bring closer to each other, groups of magnet units formed by arranging the magnet units in a plurality of arrays along the longitudinal direction of the central magnetic pole of each magnet. Thus, it is possible to further uniformize a film thickness.

As described above, in the present embodiment, a distance adjusting mechanism for adjusting a distance between the target 1 and a magnet 6 by driving a plurality of magnet units 7 and a reciprocating movement mechanism for reciprocating the magnet units 7 in parallel to the rear surface of the target 1 are housed in the magnet chamber 10a of the cathode body 10. By applying such a configuration as described above, it is possible to decrease a pressure applied to the partition plate 9 and thereby reduce the warpage thereof, while maintaining the sputtering chamber (not illustrated) and the magnet chamber 10a of the cathode body 10 in a vacuum state. In addition, it is possible to arbitrarily adjust a distance between each magnet 6 and the rear surface of the target 1, while maintaining the parallelism of each magnet unit 7 with respect to the target 1. Furthermore, it is possible to oscillate all of the magnet units 7 in synchronization in a direction parallel to the rear surface of the target 1 and perform sputtering under predetermined process conditions, while maintaining the positional arrangement of magnet units 7 after the adjustment.

EXAMPLE 1

A solar cell as one example of electronic devices was manufactured on a 730 mm×920 mm substrate using a sputtering apparatus including a sputtering cathode in accordance with the present invention described in FIGS. 1 and 2, wherein the sputtering cathode was provided with a molybdenum target and seven magnet units having a planar rectangular shape were provided on the rear-surface side of the target.

A solar cell provided with a compound semiconductor is manufactured by film-forming an Mo electrode layer to serve as a back electrode (positive electrode), a light-absorbing layer on the Mo electrode layer, and a transparent electrode layer to serve as a negative electrode and made of ZnO:Al or the like on the light-absorbing layer through a buffer layer made of ZnS, CdS or the like.

These layers are respectively deposited by means of sputtering using a magnetron-based cathode. Here, attempts were made to film-form an Mo electrode layer to serve as an electrode.

In the film formation, a two-layer laminated film composed of a lower layer (layer based on initial sputtering conditions) and an upper layer (layer based on sputtering conditions after change) was formed continuously on the basis of the optimum position of magnet units which was stored in a computer in the course of film formation and at which the variation of film thickness distribution was not increased, while changing the sputtering conditions once. This is because by changing sputtering conditions, it is possible to differentiate film quality between films formed at the start of film formation and after the completion of film formation. By doing so, it is possible to control the interrelated characteristics of thin films, such as adhesion between laminated films.

Argon was used as a sputtering gas for forming the Mo electrode layer. A substrate was placed within a sputtering chamber, the chamber was evacuated and then argon was supplied into the chamber at a flow rate of 90 sccm, while exhausting the chamber, and the internal pressure of the chamber was maintained at 0.4 Pa. A sputtering power of 60 kW was supplied from a variable DC power source to the cathode to perform film formation by sputtering for 30 seconds, thereby forming a molybdenum film having an average thickness of 150 nm as the lower layer.

When film-forming this lower layer, there was applied an arrangement of magnet units, which was previously stored in the computer and whereby the variation of film thickness distribution could be decreased at the time of molybdenum film formation under the above-described pressure and sputtering power. The variation of film thickness distribution of the lower layer was ±14%.

Next, the sputtering power was changed to 45 kW, the argon flow rate was set to 300 sccm (4.91 ml/sec), and the internal pressure of the chamber was changed to 4 Pa, to perform film formation by sputtering for 30 seconds, thereby forming a molybdenum film having an average thickness of 100 nm as the upper layer.

When film-forming this upper layer, there was applied an arrangement of magnet units, which was previously stored in the computer and whereby the variation of film thickness distribution could be decreased at the time of molybdenum film formation under the above-described pressure and sputtering power. The variation of film thickness distribution of the upper layer was ±4.6%, and the variation of film thickness distribution of the upper and lower layers combined was ±8.5%.

FIGS. 5A to 5C show the states of film thickness distribution of the lower layer, the upper layer, and the laminated layer of the upper and lower layers combined, and diagrammatic arrangements of magnet units at the time of film-forming the lower layer and the upper layer.

COMPARATIVE EXAMPLE 1

A lower layer and an upper layer were film-formed under the same sputtering conditions as in example 1, except that the arrangement of magnet units at the time of film-forming the lower layer was the same as the arrangement of magnet units at the time of film-forming the upper layer in example 1. As a result, the variation of film thickness distribution of the lower layer was ±38%, the variation of film thickness distribution of the upper layer was ±4.6%, and the variation of film thickness distribution of the upper and the lower layers combined was ±23%.

Figure 6A:
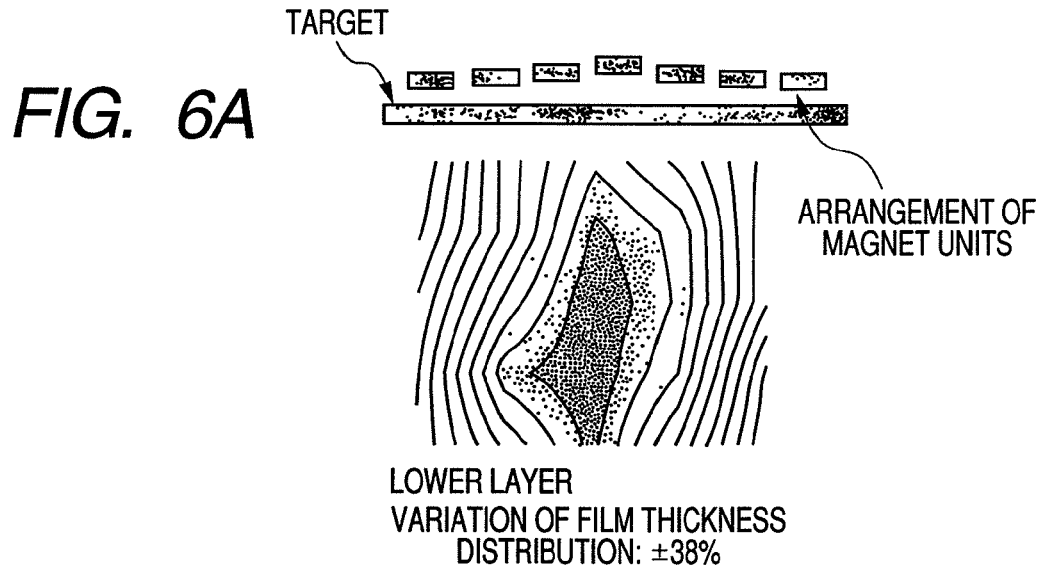
FIG. 6A is a schematic view illustrating the states of film thickness distribution of a lower layer, and a diagrammatic arrangement of magnet units at the time of film-forming the lower layer in comparative example 1 of the present invention.
Figure 6B:
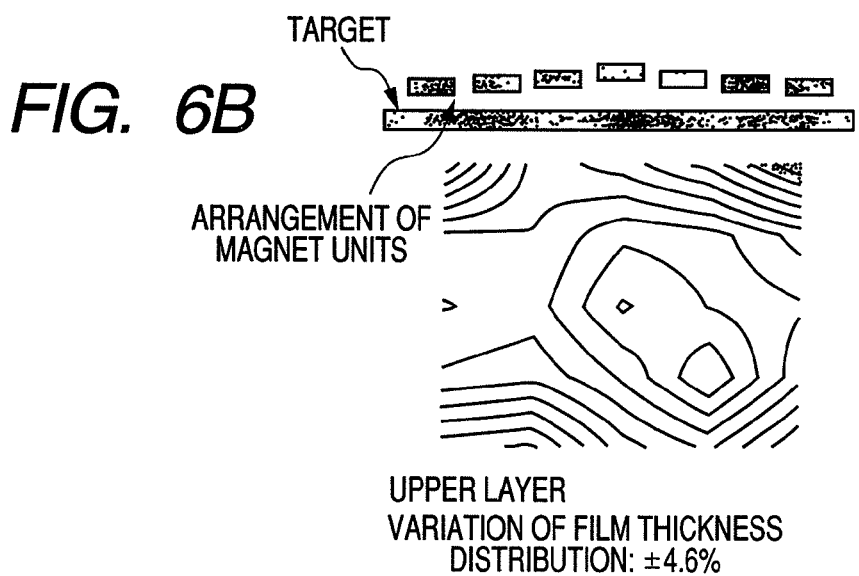
FIG. 6B is another schematic view illustrating the states of film thickness distribution of an upper layer, and a diagrammatic arrangement of magnet units at the time of film-forming the upper layer in comparative example 1 of the present invention.
Figure 6C:
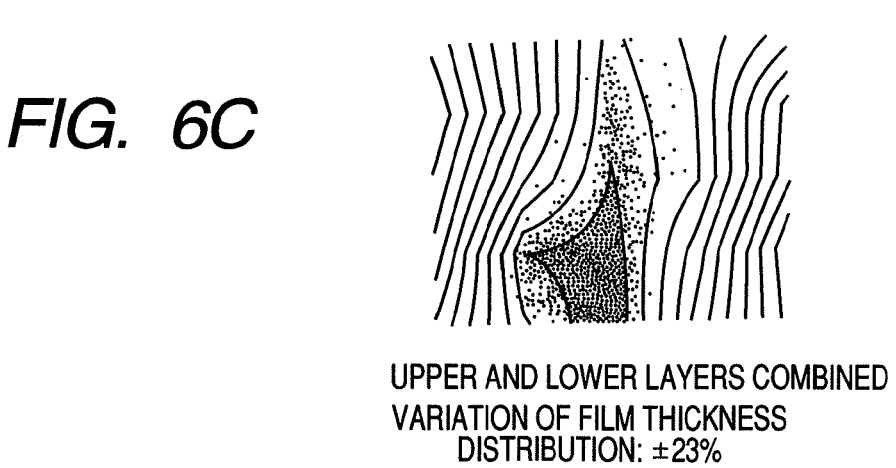
FIG. 6C is yet another schematic view illustrating the states of film thickness distribution of a lower layer and an upper layer combined in comparative example 1 of the present invention.

FIGS. 6A to 6C show the states of film thickness distribution of the lower layer, the upper layer, and the laminated layer of the upper and lower layers combined, and diagrammatic arrangements of magnet units at the time of film-forming the lower layer and the upper layer.

By performing film formation using a sputtering apparatus provided with a sputtering cathode in accordance with the present invention as described above, it has been confirmed that the variation of film thickness distribution is not increased even if sputtering conditions are changed between the start and end of film formation.

Using the same manufacturing method as described above, a solar cell as one example of electronic devices was manufactured by film-forming a light-absorbing layer on the Mo electrode layer and a transparent electrode layer to serve as a negative electrode and made of ZnO:Al or the like on the light-absorbing layer through a buffer layer made of ZnS, CdS or the like.

Note that actuators 15 are installed on the outside of the cathode body 10 which is the atmospheric pressure side. It is therefore possible to release heat generated from the actuator 15 into the air around the actuators. In the case of configuration in which the actuators 15 are provided within a vacuum space, there is the need to provide means for releasing heat generated from the actuators 15. However, in a case where the actuators 15 are provided on the atmospheric pressure side as in the present embodiment, there is no need to provide such means as described above.

Also in the case of configuration in which the actuators 15 are provided within a vacuum space, there is the need to select actuators that can also operate in a vacuum space. However, in a case where the actuators 15 are provided on the atmospheric pressure side as in the present embodiment, there is no need to use such special actuators as described above.

Furthermore, according to the configuration of the present embodiment, it is possible to automatically adjust a distance between each block of magnet units 7 and the target 1 by separately controlling the amount of displacement of the actuators 15 according to the consumption amount of the target 1. Alternatively, by separately controlling the amount of displacement of each actuator 15 according to readings from a film thickness measuring device (not illustrated) provided within the sputtering chamber (not illustrated) of a sputtering apparatus, it is possible to automatically adjust the thickness distribution of a formed film.

While preferred embodiments of the invention of the present application have been described heretofore with reference to the accompanying drawings, the present invention is not limited to such embodiments. Accordingly, the present invention may be modified into various forms within a technical scope comprehended from the appended claims.

What is claimed is:

1. A sputtering cathode comprising a plurality of magnet units arranged at positions opposite to a surface for supporting a target,
    each of the magnet units having:
    a magnet of the magnet unit;
    a distance adjusting mechanism for adjusting a distance from the magnet to the surface;
    a reciprocating movement mechanism for reciprocating the magnet in parallel to the surface; and
    a guide part configured so that the reciprocating movement mechanism is moved in a direction of the reciprocating,
    wherein the guide part is engaged with the reciprocating movement mechanism so that the reciprocating movement mechanism moves in the direction of the reciprocating, and is connected to the distance adjusting mechanism,
        the distance adjusting mechanism and the guide part are provided so that the distance adjusting mechanism and the guide part do not move in the direction of the reciprocating when the reciprocating movement mechanism moves in the direction of the reciprocating, and
        wherein magnet units are arranged along a direction different from the direction of the reciprocating.

2. The sputtering cathode according to claim 1, wherein the magnet units arranged along the predetermined direction form a group of magnet units having the longitudinal direction which is the predetermined direction, and a plurality of the groups of magnet units are arranged along the direction of the reciprocating.

3. A sputtering apparatus including a sputtering cathode according to claim 1.

4. The sputtering apparatus according to claim 3, further including:
    a sputtering chamber to arrange the target; and
    a magnet chamber in which the magnet units are arranged;
    wherein the magnet chamber is evacuated by an exhaust system different from an exhaust system for evacuating the sputtering chamber.

5. A control apparatus for controlling a sputtering apparatus according to claim 3, wherein when in predetermined film formation using the same target, sputtering conditions are changed in the course of the film formation, the control apparatus controls the distance adjusting mechanism, so as to adjust the distance in such a manner as to suppress an increase in the variation of film thickness distribution due to a change in the sputtering conditions for each time of the change and in each of the magnet units.

6. The control apparatus according to claim 5, further including:
    storage means in which positional information on the position of the magnet optimum for each sputtering condition is stored for each of the magnet units;
    acquisition means for acquiring positional information corresponding to sputtering conditions after change for each of the magnet units by referring to the storage means, in a case where sputtering conditions are changed in the course of film formation; and
    means for controlling the distance adjusting mechanism on the basis of the acquired positional information, so as to control the distance of each of the magnet units.

* * * * *